(12) United States Patent
Xie et al.

(10) Patent No.: US 9,401,408 B2
(45) Date of Patent: Jul. 26, 2016

(54) CONFINED EARLY EPITAXY WITH LOCAL INTERCONNECT CAPABILITY

(71) Applicant: GLOBALFOUNDRIES Inc., Grand Cayman (KY)

(72) Inventors: Ruilong Xie, Schenectady, NY (US); Andreas Knorr, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/676,608

(22) Filed: Apr. 1, 2015

(65) Prior Publication Data
US 2016/0190262 A1  Jun. 30, 2016

Related U.S. Application Data

(60) Provisional application No. 62/097,451, filed on Dec. 29, 2014.

(51) Int. Cl.
*H01L 21/336* (2006.01)
*H01L 29/786* (2006.01)
*H01L 21/8238* (2006.01)
*H01L 29/417* (2006.01)
(Continued)

(52) U.S. Cl.
CPC .... *H01L 29/41758* (2013.01); *H01L 21/28008* (2013.01); *H01L 21/76802* (2013.01); *H01L 21/76877* (2013.01); *H01L 27/0886* (2013.01); *H01L 29/0649* (2013.01); *H01L 29/665* (2013.01); *H01L 29/66545* (2013.01); *H01L 29/66795* (2013.01); *H01L 29/7851* (2013.01)

(58) Field of Classification Search
CPC ............... H01L 21/76877; H01L 21/76802; H01L 27/0886; H01L 29/7851; H01L 29/665; H01L 29/66545; H01L 29/0649; H01L 29/41758; H01L 29/66795
USPC .......... 438/229, 283, 620, 666; 257/368, 369, 257/401, 409, 774, E21.165, E21.633, 257/E21.634, E21.641, E29.12, E29.13, 257/E29.116, E29.277
See application file for complete search history.

(56) References Cited

U.S. PATENT DOCUMENTS 8,358,012 B2 * 1/2013 Haran ............... H01L 21/28518
257/382
8,502,319 B2 * 8/2013 Takeda ............... H01L 29/0847
257/368

(Continued)

*Primary Examiner* — Dao H Nguyen
(74) *Attorney, Agent, or Firm* — Wayne F. Reinke; Heslin Rothenberg Farley & Mesiti P.C.

(57) ABSTRACT

A non-planar semiconductor structure includes a semiconductor substrate, multiple raised semiconductor structures coupled to the substrate and surrounded at a lower portion thereof by a layer of isolation material, gate structure(s) and confined epitaxial material above active regions of the raised structures, the confined epitaxial material having recessed portion(s) therein. Dummy gate structures surrounding a portion of each of the raised structures are initially used, and the confined epitaxial material is created before replacing the dummy gate structures with final gate structures. The structure further includes silicide on upper surfaces of a top portion of the confined epitaxial material, and contacts above the silicide, the contacts including separate contacts electrically coupled to only one area of confined epitaxial material and common contact(s) electrically coupling two adjacent areas of the confined epitaxial material.

19 Claims, 19 Drawing Sheets

(51) Int. Cl.
*H01L 29/78* (2006.01)
*H01L 29/66* (2006.01)
*H01L 29/06* (2006.01)
*H01L 21/28* (2006.01)
*H01L 21/768* (2006.01)
*H01L 27/088* (2006.01)

(56) References Cited

U.S. PATENT DOCUMENTS 8,975,142 B2 * 3/2015 Paul .................. H01L 29/66795
257/288
2015/0104913 A1 * 4/2015 Liu .................. H01L 21/823821
438/229

* cited by examiner

CONFINED EARLY EPITAXY WITH LOCAL INTERCONNECT CAPABILITY

CROSS-REFERENCE TO RELATED APPLICATIONS

This application claims priority under 35 U.S.C. §119 to U.S. Provisional Application No. 62/097,451, filed Dec. 29, 2014, which is hereby incorporated by reference herein in its entirety.

BACKGROUND OF THE INVENTION

1. Technical Field

The present invention generally relates to contacts for semiconductor devices. More particularly, the present invention relates to contact structures and the use of confined epitaxial material for active regions of semiconductor devices.

2. Background Information

As overall semiconductor device size continues to shrink, the space allotted to each feature gets smaller. For example, non-planar transistors using epitaxial semiconductor material for the source and drain would suffer inadequate size, in light of the vulnerability of the epitaxial material to fabrication processes (e.g., contact etches) and the resulting high resistance. In addition, the inadequate size of the epitaxial material leaves inadequate area for silicide, and results in a contact resistivity that is too high. Further, inadequately sized epitaxial material cannot simply be addressed by growing more epitaxial material, as that can lead to various device short failures, due to the narrow distance between devices and lateral growth of the epitaxial material.

Thus, a need exists for improvements to source and drain contact resistivity.

SUMMARY OF THE INVENTION

The shortcomings of the prior art are overcome and additional advantages are provided through the provision, in one aspect, of a method of improving contact resistivity in semiconductor devices. The method includes providing a starting semiconductor structure, the structure including a semiconductor substrate, at least one fin coupled to the substrate and surrounded at a lower portion thereof by a layer of isolation material, and at least one dummy gate structure encompassing a portion of the at least one fin, each dummy gate structure being surrounded by a hard mask material, the hard mask material forming a cap and spacers for each dummy gate structure. The method further includes confinedly creating semiconductor epitaxial material above one or more active regions of the at least one fin prior to replacing the dummy gate structure. The confinedly creating includes forming a blanket conformal dielectric layer above the structure, removing portions of the blanket conformal dielectric layer to expose the at least one fin, and growing the semiconductor epitaxial material using the exposed at least one fin as a seed, walls of the dielectric material left by the removing serving to confine the growth of the semiconductor epitaxial material.

In accordance with another aspect, a non-planar semiconductor structure is provided. The structure includes a semiconductor substrate, a plurality of fins coupled to the substrate and surrounded at a lower portion thereof by a layer of isolation material, and confined epitaxial material above active regions of the plurality of fins, the confined epitaxial material having a recessed center portion. The structure further includes at least one replacement gate structure surrounding a portion of each fin, the at least one replacement gate structure including a cap and spacers, the confined epitaxial material, in a cross-section taken through a fin, being confined horizontally along an entire height thereof by each spacer and a corresponding wall of dielectric material. The structure further includes silicide on upper surfaces of the confined epitaxial material, and a plurality of contacts above the silicide, the plurality of contacts comprising at least one separate contact and at least one common contact.

In accordance with yet another aspect, a method. The method includes providing a starting semiconductor structure, the structure including a semiconductor substrate, at least one fin coupled to the substrate and surrounded at a lower portion thereof by a layer of isolation material, at least one dummy gate structure encompassing a portion of the at least one fin, each dummy gate structure being surrounded by a hard mask material, the hard mask material forming a cap and spacers for each dummy gate structure. The method further includes confinedly creating semiconductor epitaxial material above one or more active regions of the at least one fin prior to replacing the dummy gate structure, filling with conductive material a portion of an open area between portions of epitaxial material and an opening therebelow in the isolation layer, replacing the dummy gate structure with a replacement gate structure, creating silicide on exposed surfaces of the epitaxial material, and creating one or more contacts to the epitaxial material.

These, and other objects, features and advantages of this invention will become apparent from the following detailed description of the various aspects of the invention taken in conjunction with the accompanying drawings.

DETAILED DESCRIPTION OF THE INVENTION

Figure 1:
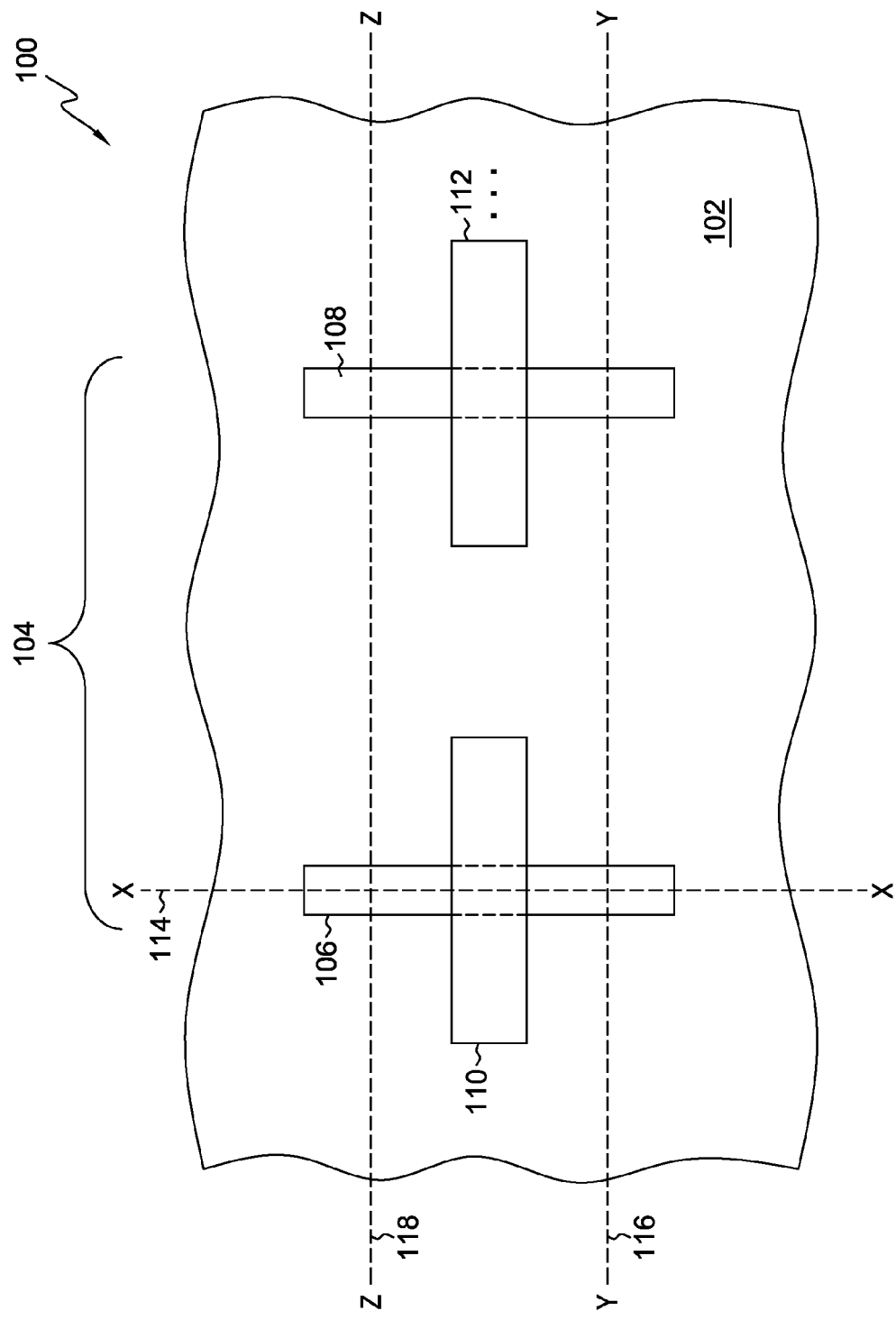
FIG. 1 is a top-down view of a starting non-planar semiconductor structure, the starting structure including a semiconductor substrate, multiple raised structures, and dummy gate structures covering a center portion of the raised structures, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

FIG. 1 is a top-down view of a starting non-planar semiconductor structure 100, the starting structure including a semiconductor substrate 102, multiple raised structures 104, e.g., raised structures 106 and 108, and dummy gate structures 110 and 112 encompassing a center portion of raised structures 106 and 108, respectively, in accordance with one or more aspects of the present invention. The starting structure may be conventionally fabricated, for example, using known processes and techniques. However, it will be understood that the fabrication of the starting structure forms no part of the present invention. Further, although only a portion is shown for simplicity, it will be understood that, in practice, many such structures are typically included on the same bulk substrate.

In one example, substrate 102 may include any silicon-containing substrate including, but not limited to, silicon (Si), bulk silicon, single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof an alloy semiconductor including GaAsP, AlInAs, GaInAs, GaInP, or GaInAsP or combinations thereof.

In one example, the raised structures may each take the form of a "fin." The raised structures may be etched from a bulk substrate, and may include, for example, any of the materials listed above with respect to the substrate. Further, some or all of the raised structures may include added impurities (e.g., by doping), making them n-type or p-type.

Figure 2:
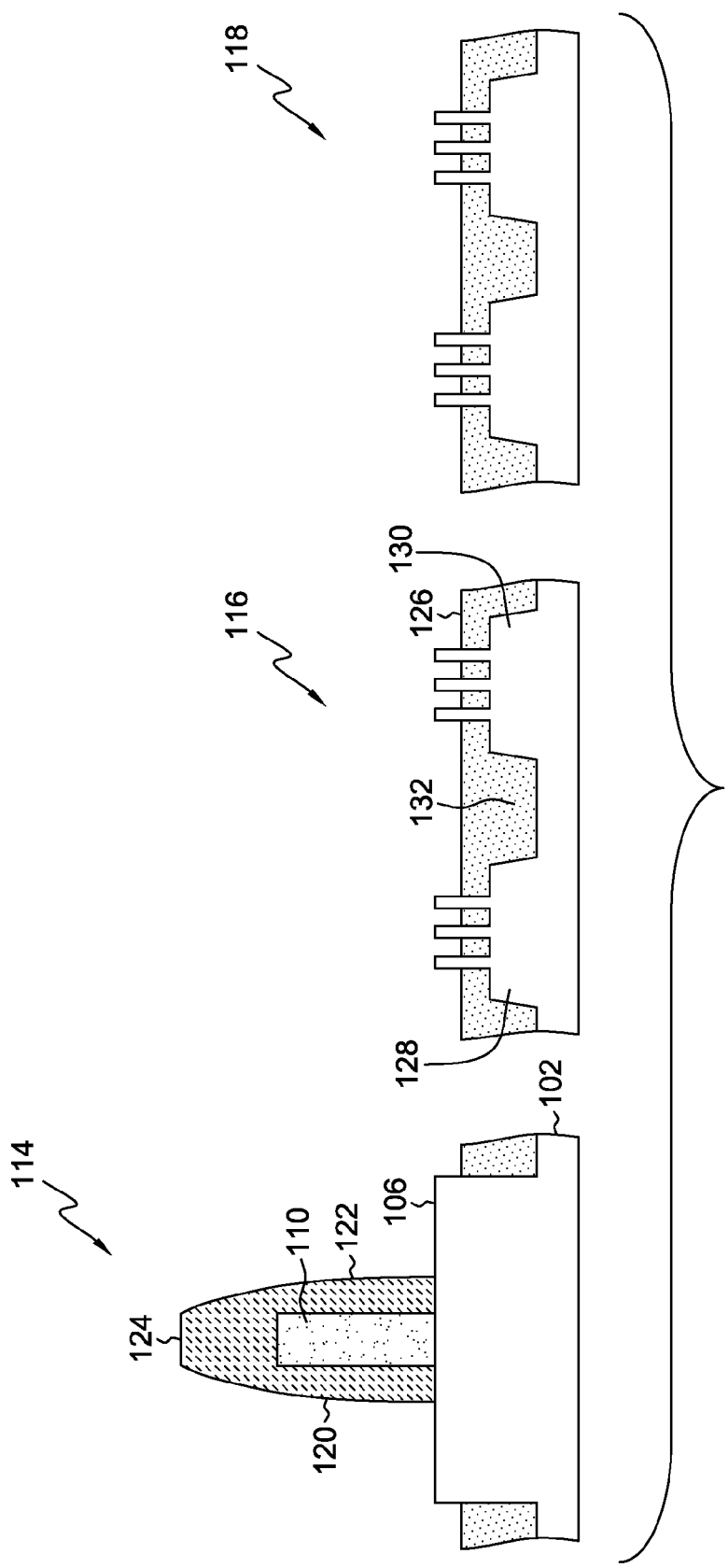
FIG. 2 depicts various cross-sections of the starting structure of FIG. 1. As shown, the dummy gates are surrounded by spacers, and a gate cap, all of which may include, for example, a hard mask material (e.g., silicon nitride). As shown, the raised structures are surrounded at a lower portion thereof by a layer of isolation material, and between the raised structure bases are trenches filled with isolation material, which may be, for example, a same isolation material as the isolation layer (e.g., silicon dioxide).

FIG. 2 depicts various cross-sections of the starting structure of FIG. 1; namely, cross-sections 114, 116 and 118, taken along the lines of like numbers in FIG. 1. As shown, dummy gates 110 and 112 are surrounded by spacers 120 and 122, and gate cap 124, all of which may include, for example, a hard mask material (e.g., silicon nitride). As shown in views 116 and 118, the raised structures are surrounded at a lower portion thereof by a layer 126 of isolation material, and between the raised structure bases 128 and 130 are trenches filled with isolation material 132, which may be, for example, a same isolation material as isolation layer 126 (e.g., silicon dioxide).

Figure 3:
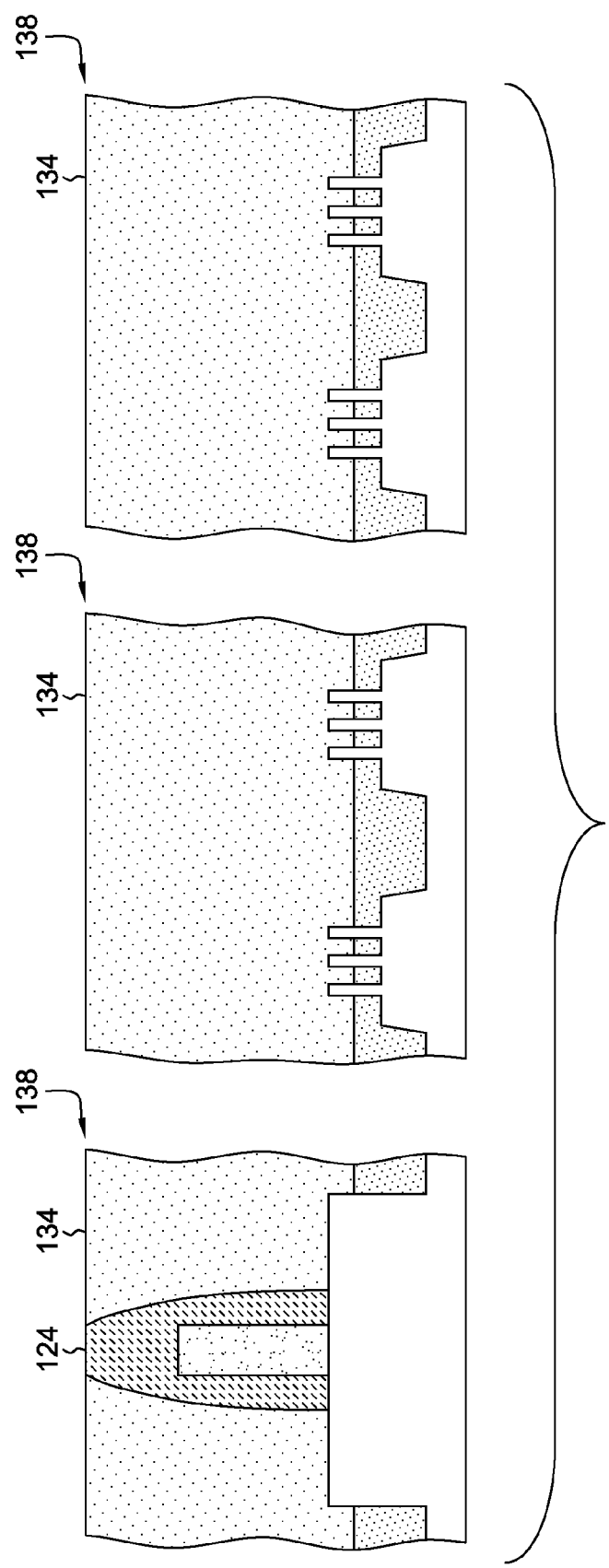
FIG. 3 depicts the starting structure of FIG. 2 after creating a blanket conformal layer of dielectric material over the structure and planarizing using the gate cap as a stop, for example, using a chemical-mechanical polishing process, in accordance with one or more aspects of the present invention.

FIG. 3 depicts the starting structure of FIG. 2 after creating a blanket conformal layer 134 of dielectric material over the structure (e.g., by deposition) and planarizing, preferably using the gate cap 124 as a stop, for example, using a chemical-mechanical polishing (CMP) process, in accordance with one or more aspects of the present invention.

Figure 4:
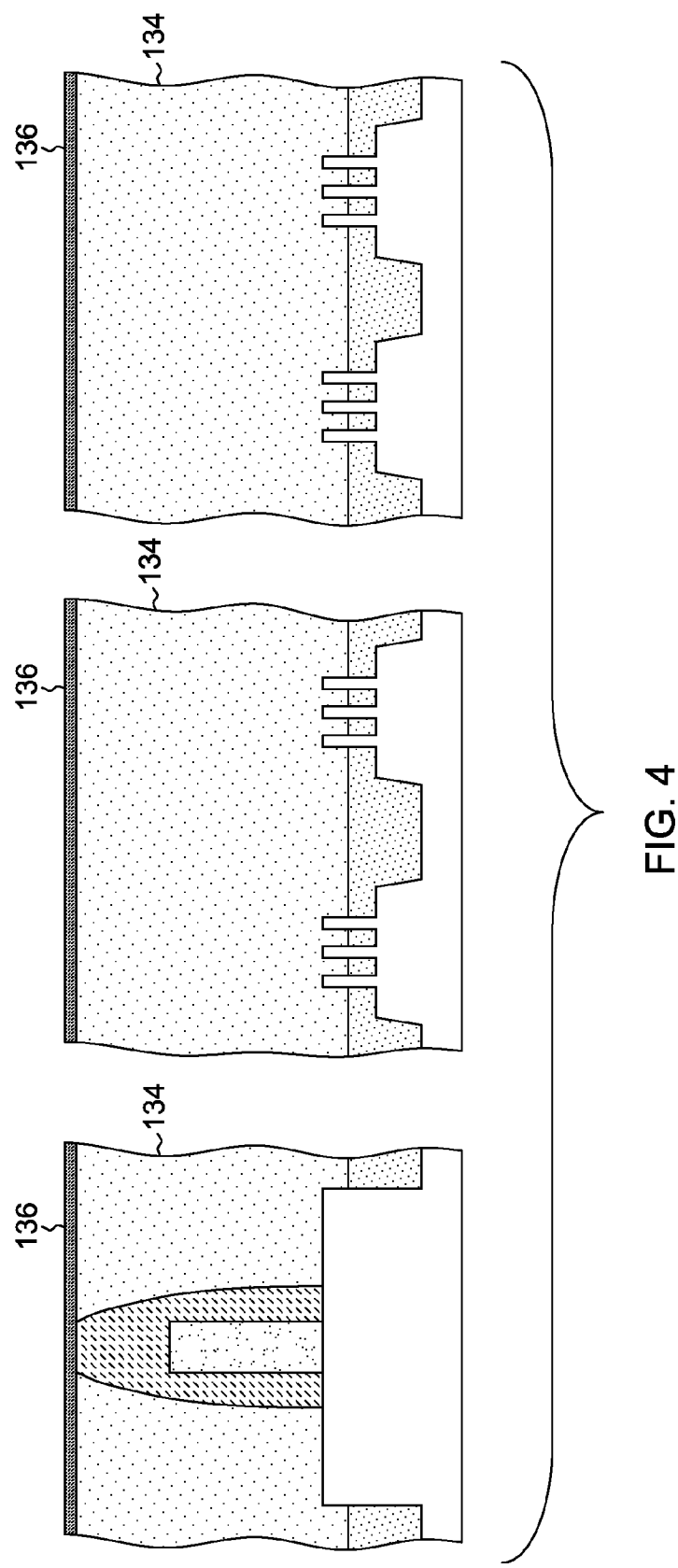
FIG. 4 depicts the structure of FIG. 3 after creating a thin (e.g., about 5 nm to about 10 nm) layer of hard mask material (e.g., silicon nitride) over the planarized top surface, in accordance with one or more aspects of the present invention.

FIG. 4 depicts the structure of FIG. 3 after creating a thin (e.g., about 5 nm to about 10 nm) layer 136 of hard mask material (e.g., silicon nitride) over the planarized top surface (138, FIG. 3), in accordance with one or more aspects of the present invention. The layer of hard mask material may be created using, for example, conventional processes and techniques.

Figure 5:
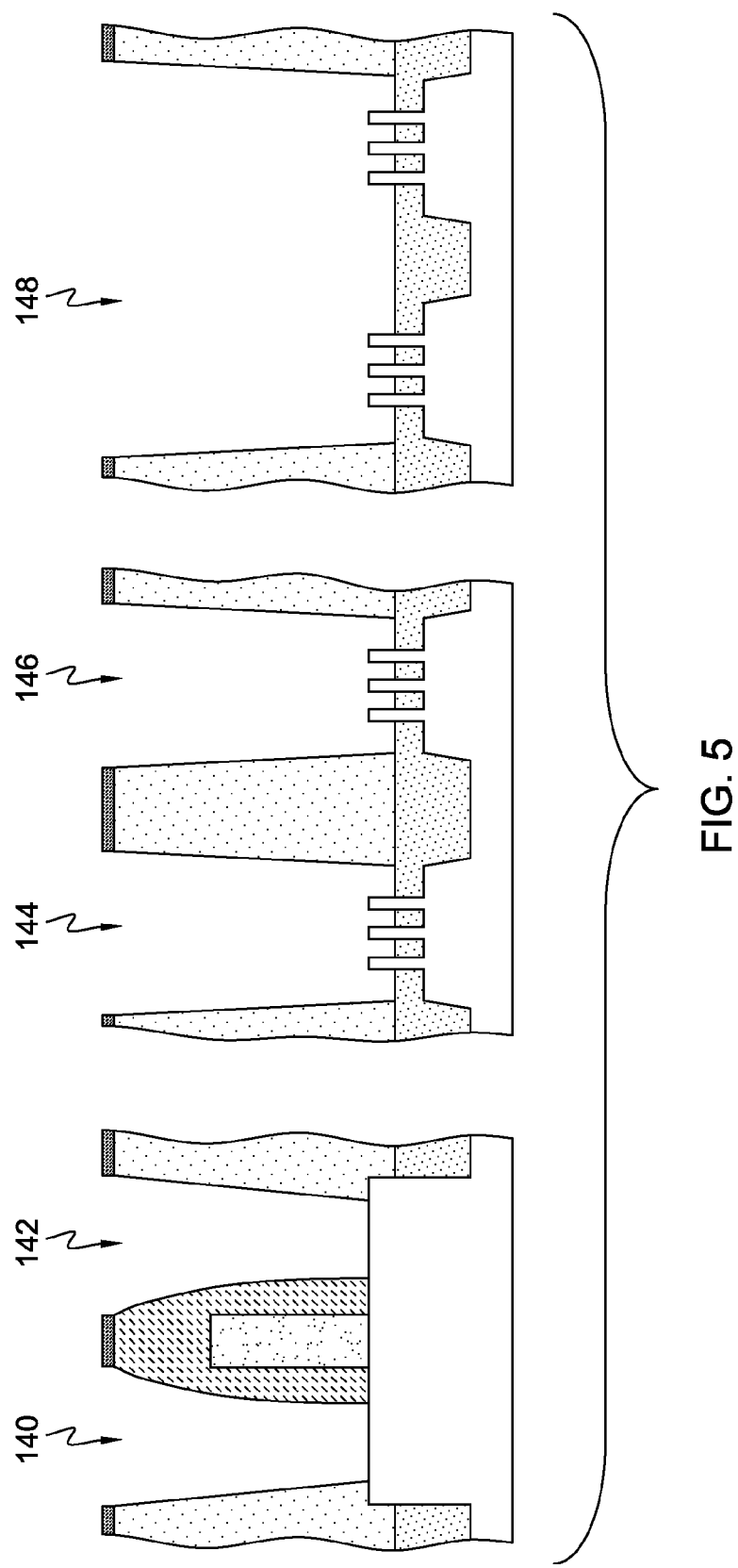
FIG. 5 depicts the structure of FIG. 4 after creating openings to one or more of the raised structure(s) adjacent the spacers, for example, by patterning and etching. The openings include individual contact structures as well as common contact structures, in accordance with one or more aspects of the present invention.

FIG. 5 depicts the structure of FIG. 4 after creating openings 140, 142, 144, 146 and 148 to one or more of the raised structures adjacent the spacers, for example, by patterning and etching. In one example, a two-step process to create the openings may be used, including an initial process to remove the layer 136 of hard mask material, followed by a selective etch, for example, an oxide etch to remove the dielectric material 134, selective to the gate cap and gate spacer material(s). Openings 144 and 146 are for individual contact structures, while opening 148 is for a common contact structure, in accordance with one or more aspects of the present invention. Based on FIGS. 1 and 2, opening 140 corresponds to opening 144 from a different angle, while opening 142 corresponds to opening 148 from a different angle.

Figure 6:
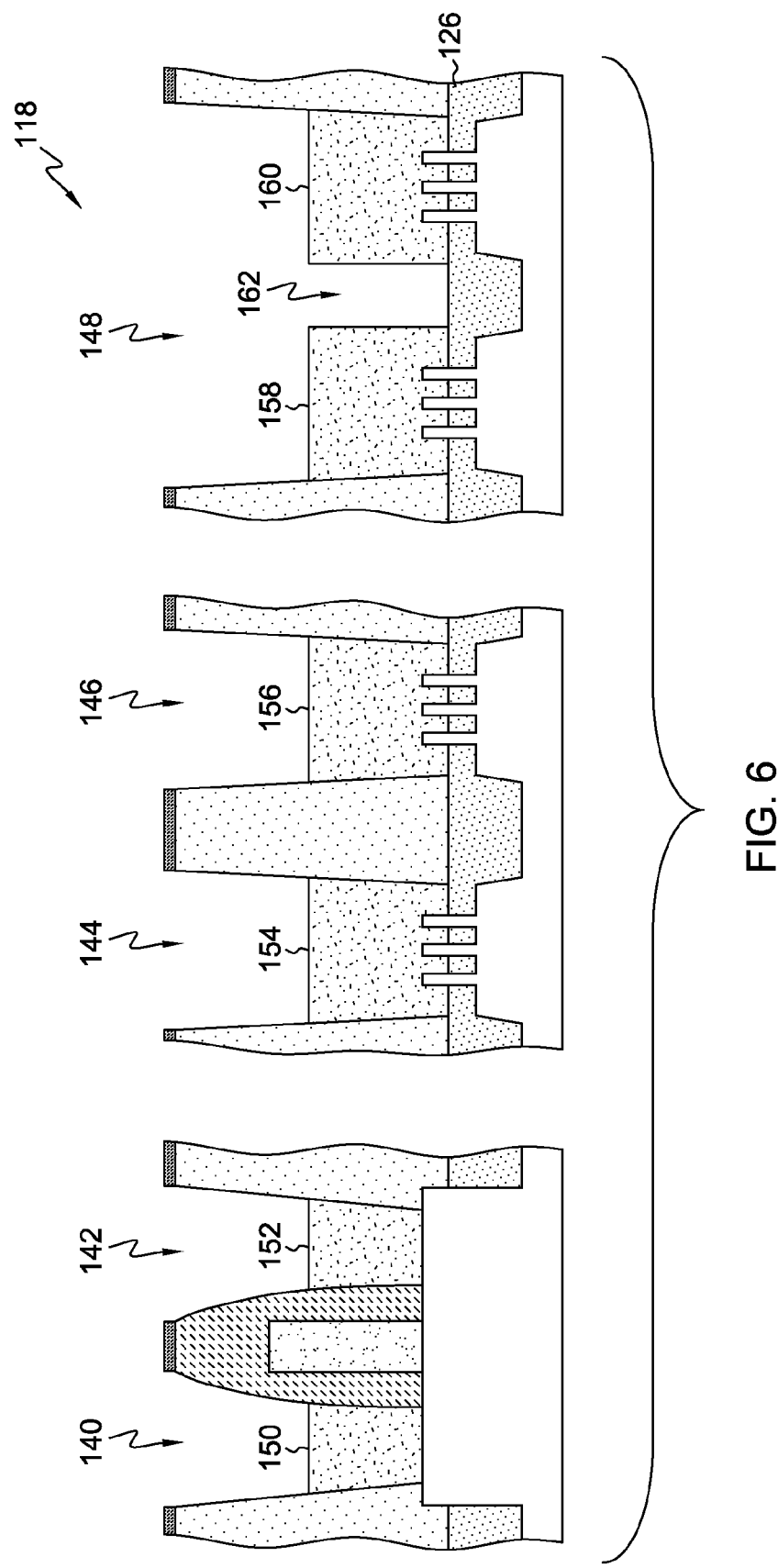
FIG. 6 depicts the structure of FIG. 5 after creating epitaxial material in a portion of each opening, for example, by growing naturally shaped epitaxial structures, in accordance with one or more aspects of the present invention.

FIG. 6 depicts the structure of FIG. 5 after creating epitaxial material 150, 152, 154, 156, 158 and 160 in a portion of each opening, for example, by growing epitaxial material (e.g., naturally shaped epitaxial structures) using, for example, conventional processes and techniques, in accordance with one or more aspects of the present invention. In one example, the epitaxial material may be grown from the raised structures. Based on the description of FIG. 5, epitaxial material 150 corresponds to epitaxial material 154 from a different angle, while epitaxial material 152 corresponds to epitaxial material 158 from a different angle.

As shown in view 118 of FIG. 6, an opening 162 to isolation layer 126 separates epitaxial material 158 from epitaxial material 160. Where the epitaxial material is grown from the raised structures, opening 162 may simply result from the growth not being enough laterally for any merger between epitaxial material 158 and 160 to take place.

Figure 7:
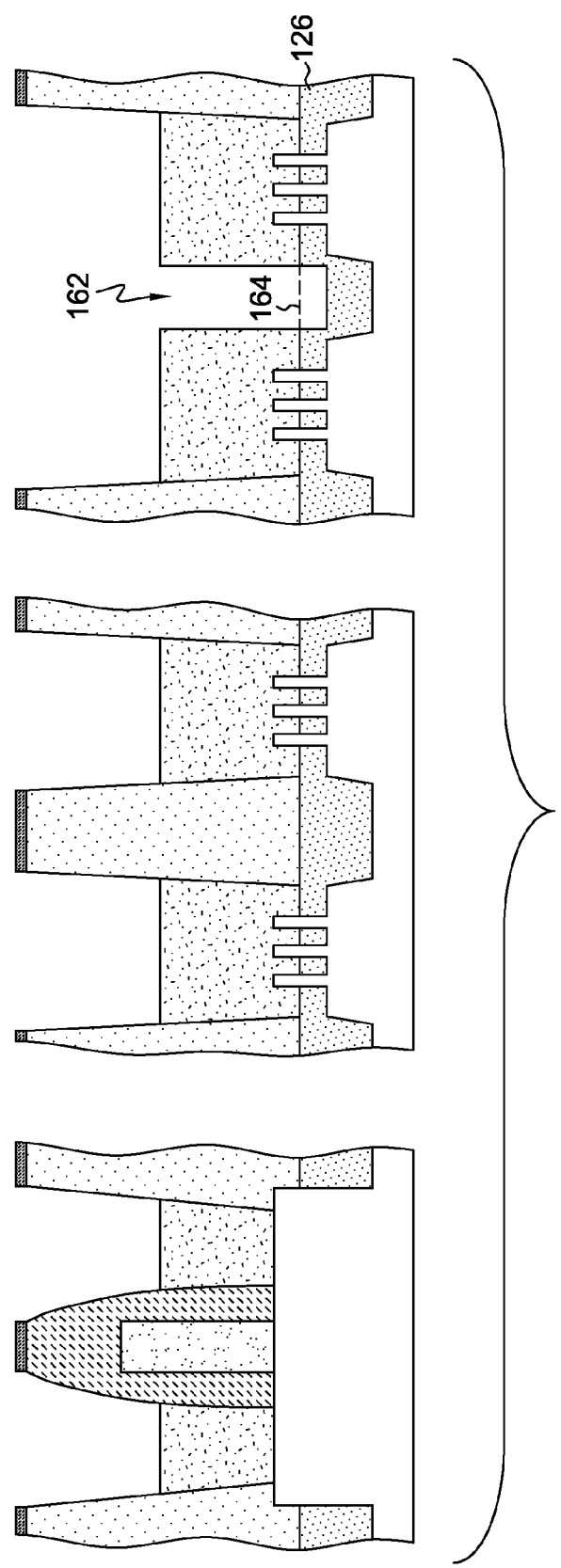
FIG. 7 depicts the common contact portion of the structure of FIG. 6 after removing a portion of the layer of isolation material below the opening in the epitaxial material, effectively extending the opening, in accordance with one or more aspects of the present invention.

FIG. 7 depicts the common contact portion of the structure of FIG. 6 after removing a portion 164 of the layer 126 of isolation material below the opening 162 in the epitaxial material, effectively extending opening 162 downwardly, in accordance with one or more aspects of the present invention. The benefit of extending the opening allows for a larger volume of conductive material, which lowers the source/drain lateral resistance. The removal of portion 164 may be accomplished, for example, using conventional processes and techniques. In one example, a fixed time oxide etch, selective to surrounding materials (e.g., epitaxial material and/or hard mask material) may be used.

Figure 8:
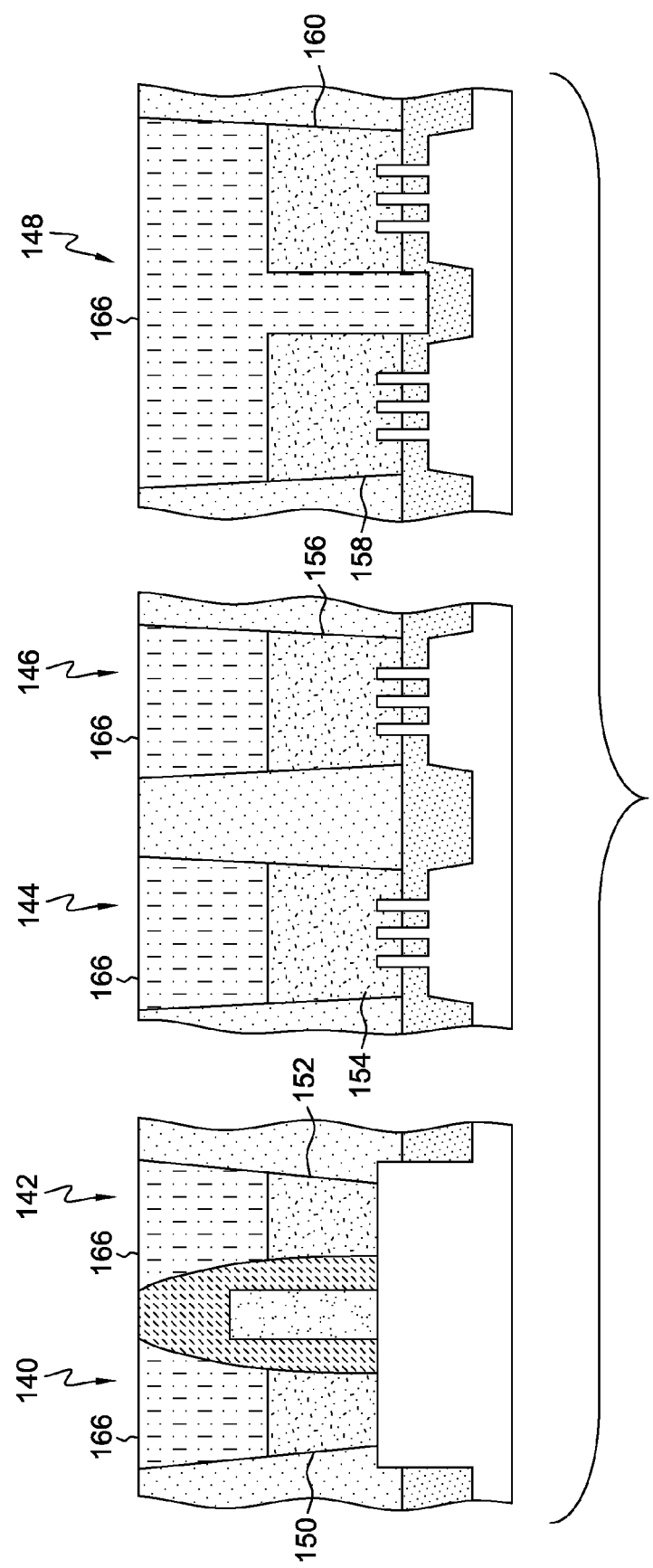
FIG. 8 depicts the structure of FIG. 7 after filling the openings above the epitaxial material with conductive material (e.g., tungsten) and planarizing using the gate cap as a stop, in accordance with one or more aspects of the present invention.

FIG. 8 depicts the structure of FIG. 7 after filling the openings 140, 142, 144, 146 and 148 above the epitaxial material 150, 152, 154, 156, 158 and 160, respectively, with conductive material 166 (e.g., tungsten) and planarizing, preferably using the gate cap 124 as a stop (e.g., using a CMP process), in accordance with one or more aspects of the present invention. Filling the openings may be accomplished, for example, using conventional processes and techniques.

Figure 9:
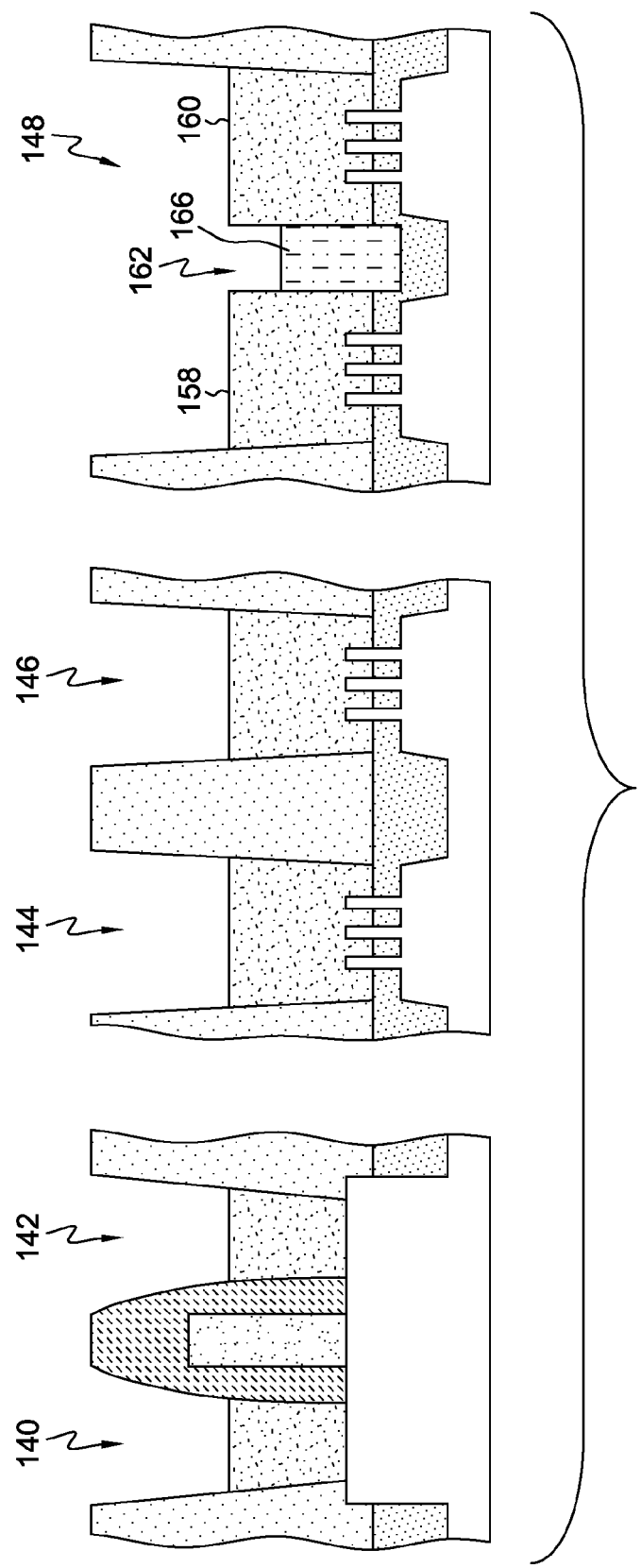
FIG. 9 depicts the structure of FIG. 8 after recessing the conductive material, effectively removing it everywhere except in a lower portion of the opening, the conductive material electrically connecting the epitaxial material, in accordance with one or more aspects of the present invention.

FIG. 9 depicts the structure of FIG. 8 after recessing the conductive material 166 (e.g., using conventional processes and techniques), removing it everywhere except in a lower portion of opening 162, the remaining conductive material effectively creating a lower contact electrically coupling adjacent epitaxial material 158 and 160, in accordance with one or more aspects of the present invention.

Figure 10:
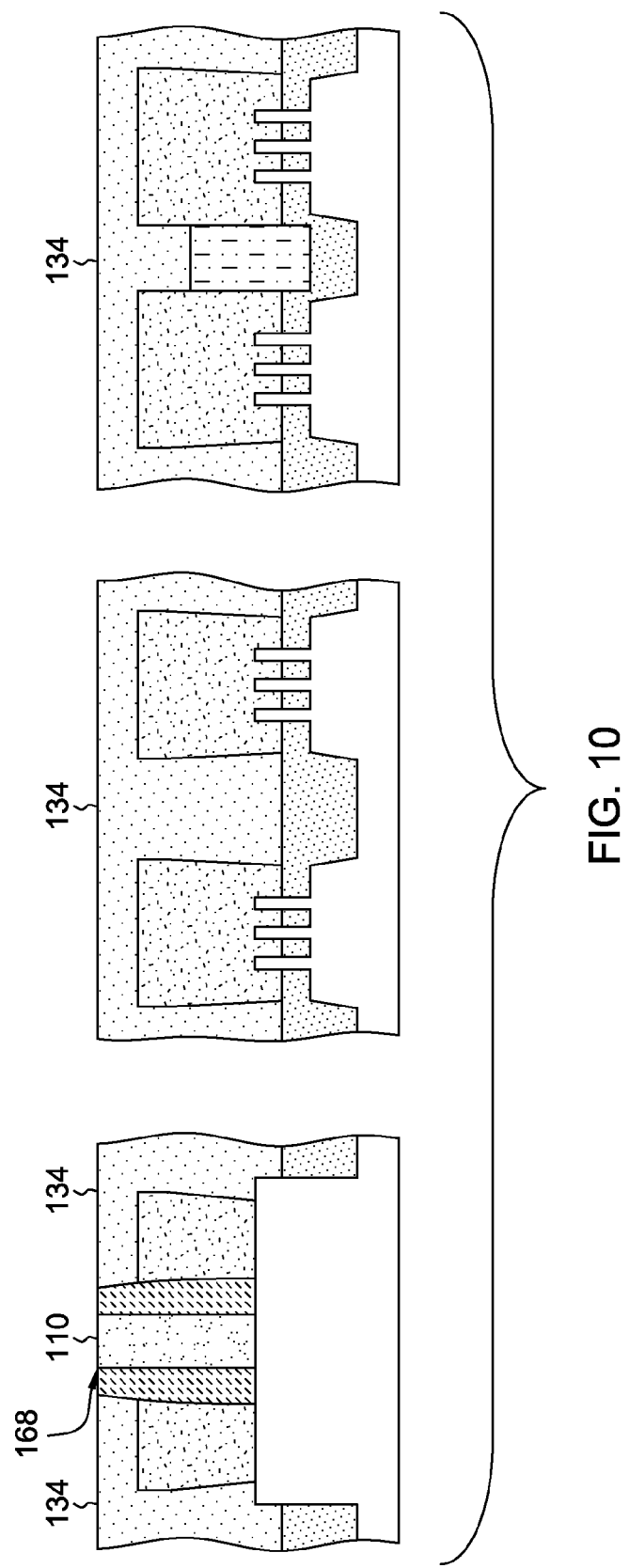
FIG. 10 depicts the structure of FIG. 9 after filling all the openings with more of the dielectric material and recessing to remove the gate cap, exposing the dummy gate structure at a top surface thereof, in accordance with one or more aspects of the present invention.

FIG. 10 depicts the structure of FIG. 9 after filling all the openings with more of the dielectric material 134 (e.g., using conventional processes and techniques) and recessing (e.g., using a CMP process) to remove the gate cap (124, FIG. 3), exposing the dummy gate structure 110 at a top surface 168 thereof, in accordance with one or more aspects of the present invention.

Figure 11:
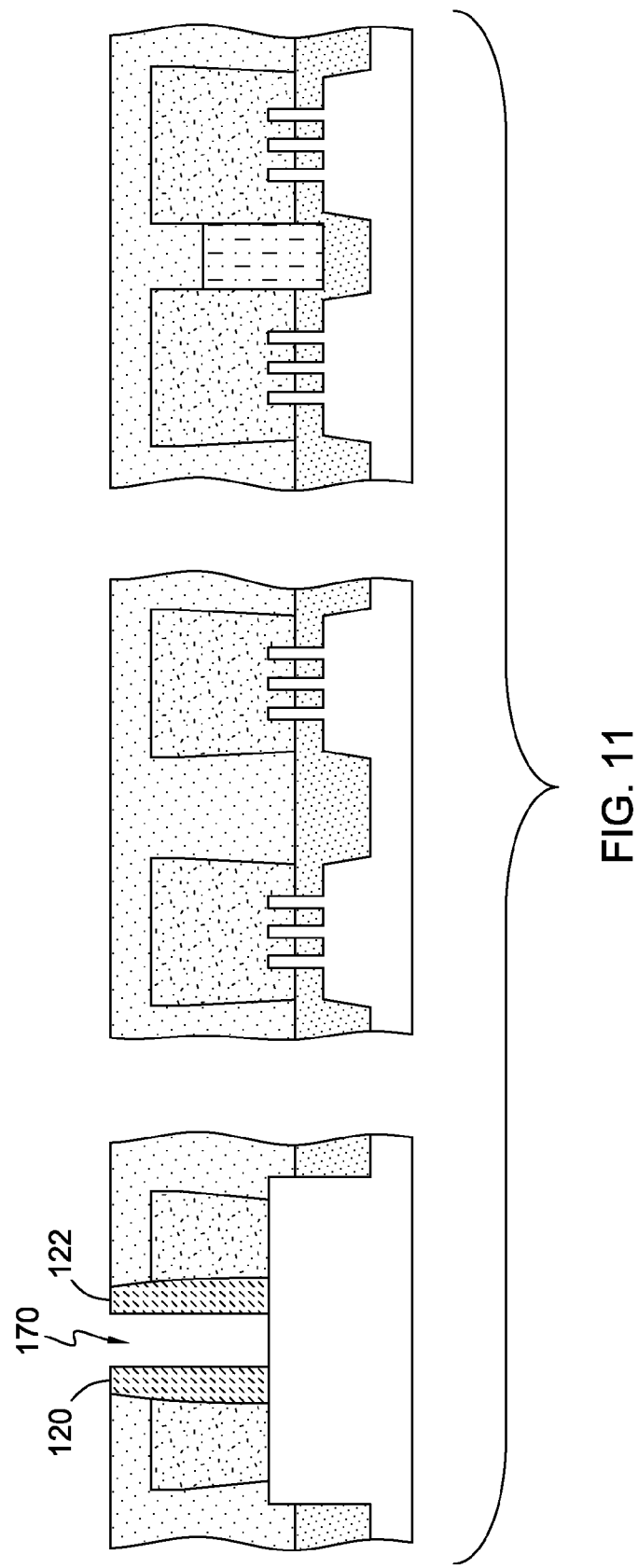
FIG. 11 depicts the structure of FIG. 10 after removing the dummy gate structure(s), leaving a gate opening between the spacers, in accordance with one or more aspects of the present invention.

FIG. 11 depicts the structure of FIG. 10 after removing the dummy gate structure(s) (110, FIG. 10), e.g., using conventional processes and techniques, the removing creating gate opening 170 between spacers 120 and 122, in accordance with one or more aspects of the present invention.

Figure 12:
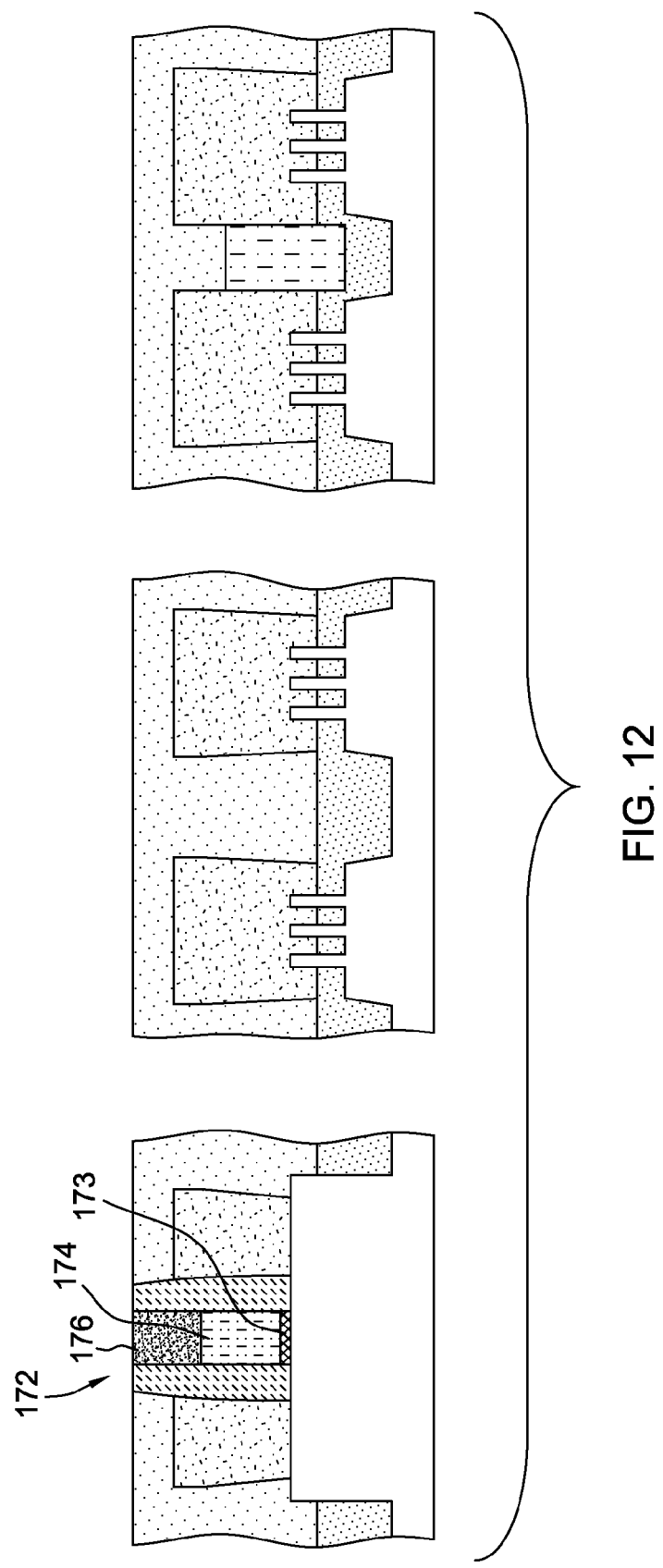
FIG. 12 depicts the structure of FIG. 11 after creating a replacement gate structure in the gate opening, including a conductive material (e.g., a metal) and a gate cap made of a hard mask material, in accordance with one or more aspects of the present invention.

FIG. 12 depicts the structure of FIG. 11 after creating a replacement gate structure 172 in the gate opening (170, FIG. 11), e.g., using conventional processes and techniques, the replacement gate structure including a layer 173 of gate insulator material (e.g., a high-k dielectric material, such as hafnium oxide), conductive material 174, for example, one or more work function metals (e.g., TiN, TaN, TiC), conductive metals (e.g., tungsten) and a gate cap 176 made of, for example, silicon nitride. The gate cap may be created, for example, by recessing the conductive material(s) 174, followed by SiN deposition and a chemical-mechanical polishing process, in accordance with one or more aspects of the present invention.

Figure 13:
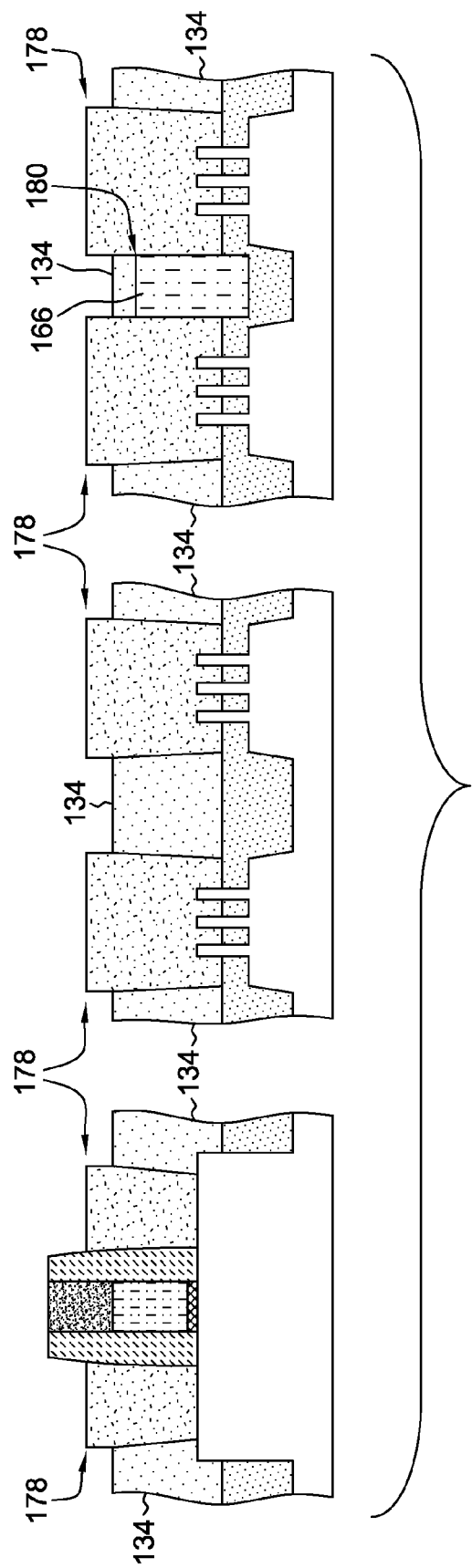
FIG. 13 depicts the structure of FIG. 12 after recessing the dielectric material (e.g., using an oxide deglazing process) below a top surface of the epitaxial material, exposing a top portion thereof, while still covering a top surface of the (first) conductive material, in accordance with one or more aspects of the present invention.

FIG. 13 depicts the structure of FIG. 12 after recessing the dielectric material 134 (e.g., using an oxide deglazing process) below a top surface 178 of the epitaxial material, exposing a top portion thereof, the epitaxial material still covering a top surface 180 of conductive material 166, in accordance with one or more aspects of the present invention.

Figure 14:
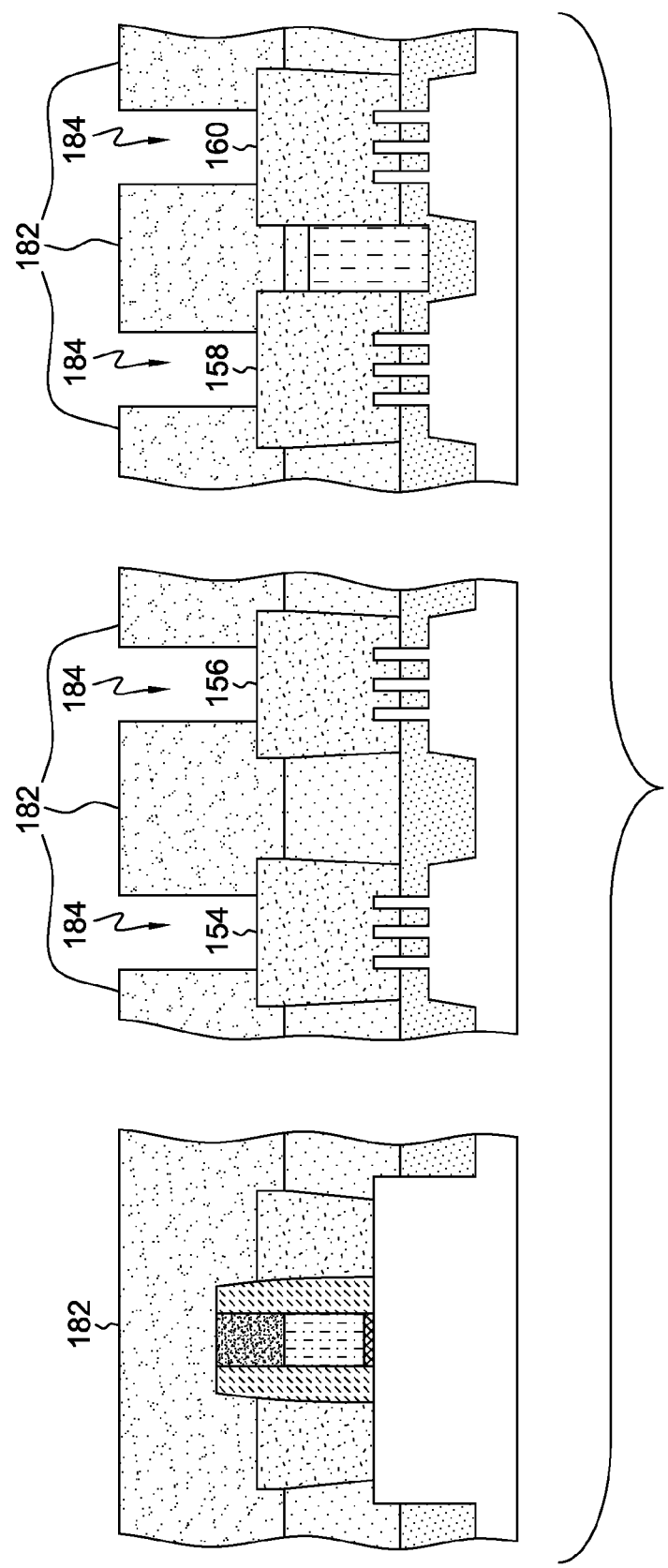
FIG. 14 depicts the structure of FIG. 13 after creating a conformal blanket layer of a patterning material (e.g., an organic planarization layer) over the structure and patterning to expose the epitaxial material, in accordance with one or more aspects of the present invention.

FIG. 14 depicts the structure of FIG. 13 after creating a conformal blanket layer 182 of patterning material (e.g., an organic planarization layer) over the structure (e.g., using conventional processes and techniques) and patterning 184 (e.g., via lithography) to expose the epitaxial material 154, 156, 158 and 160, in accordance with one or more aspects of the present invention.

Figure 15:
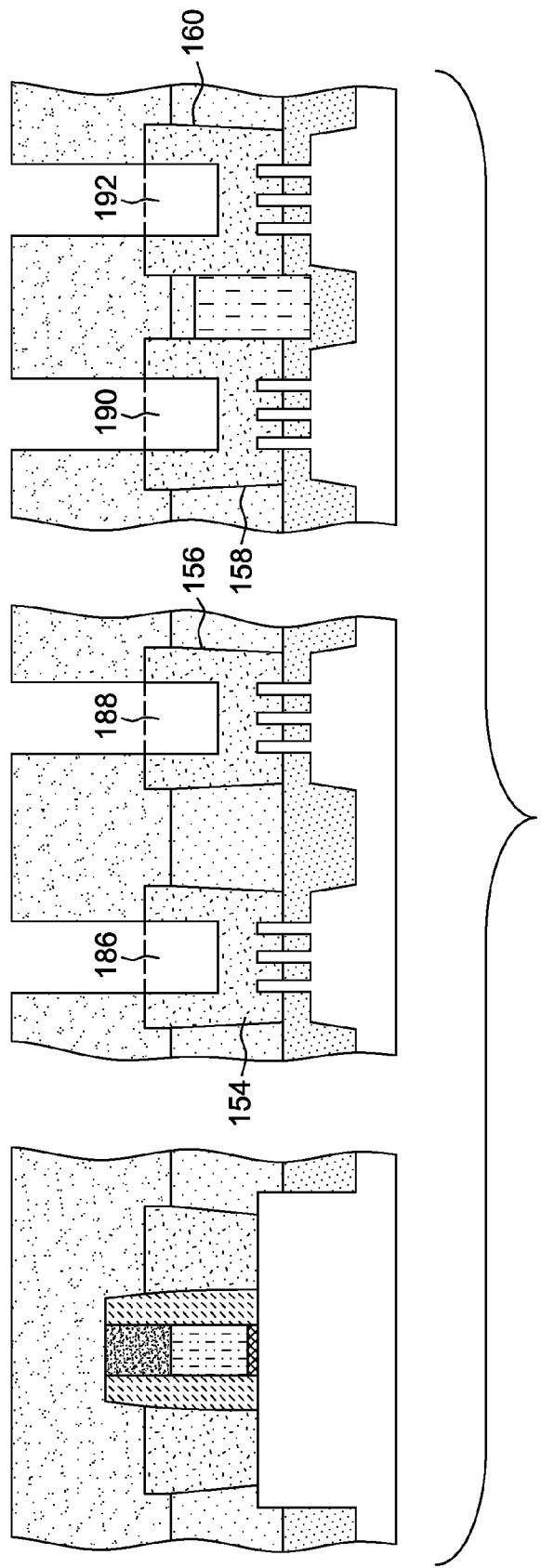
FIG. 15 depicts the structure of FIG. 14 after removing a center portion of the exposed epitaxial material, in accordance with one or more aspects of the present invention.

FIG. 15 depicts the structure of FIG. 14 after removing at least one portion; in this example, a center portion 186, 188, 190 and 192 of the exposed epitaxial material 154, 156, 158 and 160, respectively, in accordance with one or more aspects of the present invention. The center portions may be removed, for example, using a conventional dry etch process for epitaxial materials, such as Si or SiGe.

Figure 16:
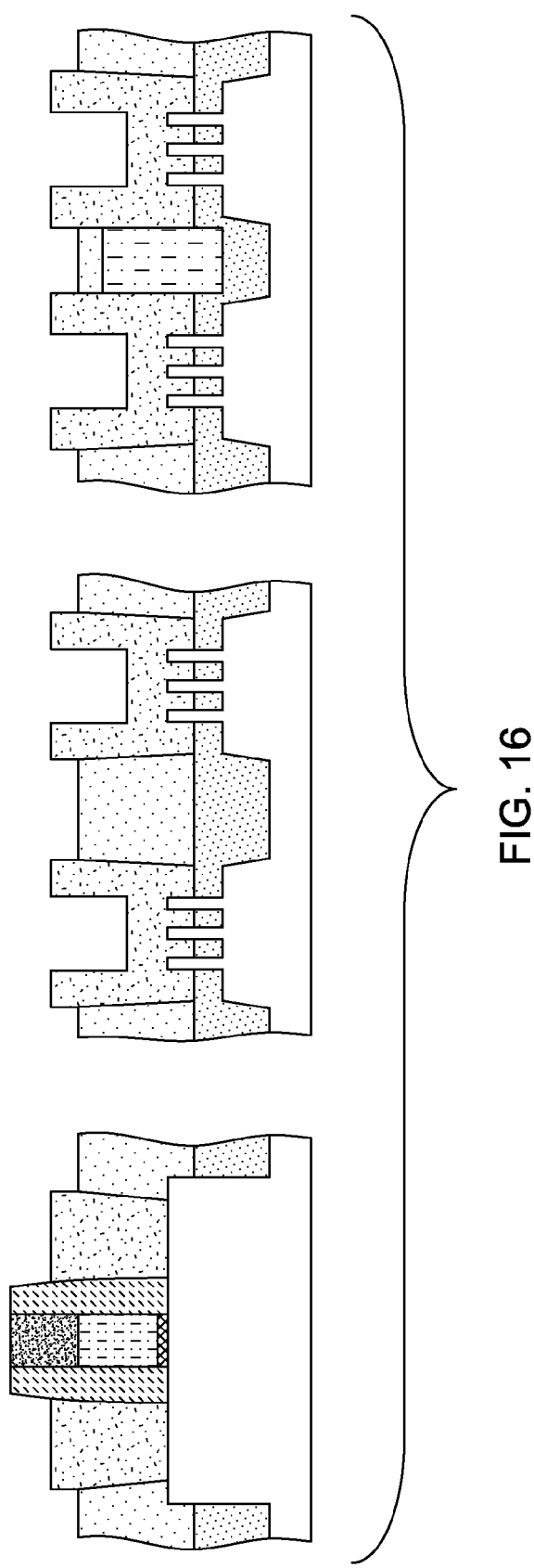
FIG. 16 depicts the structure of FIG. 15 after removal of the layer of patterning material, in accordance with one or more aspects of the present invention.

FIG. 16 depicts the structure of FIG. 15 after removal of the layer (182, FIG. 14) of patterning material, for example, using conventional processes and techniques, in accordance with one or more aspects of the present invention.

Figure 17:
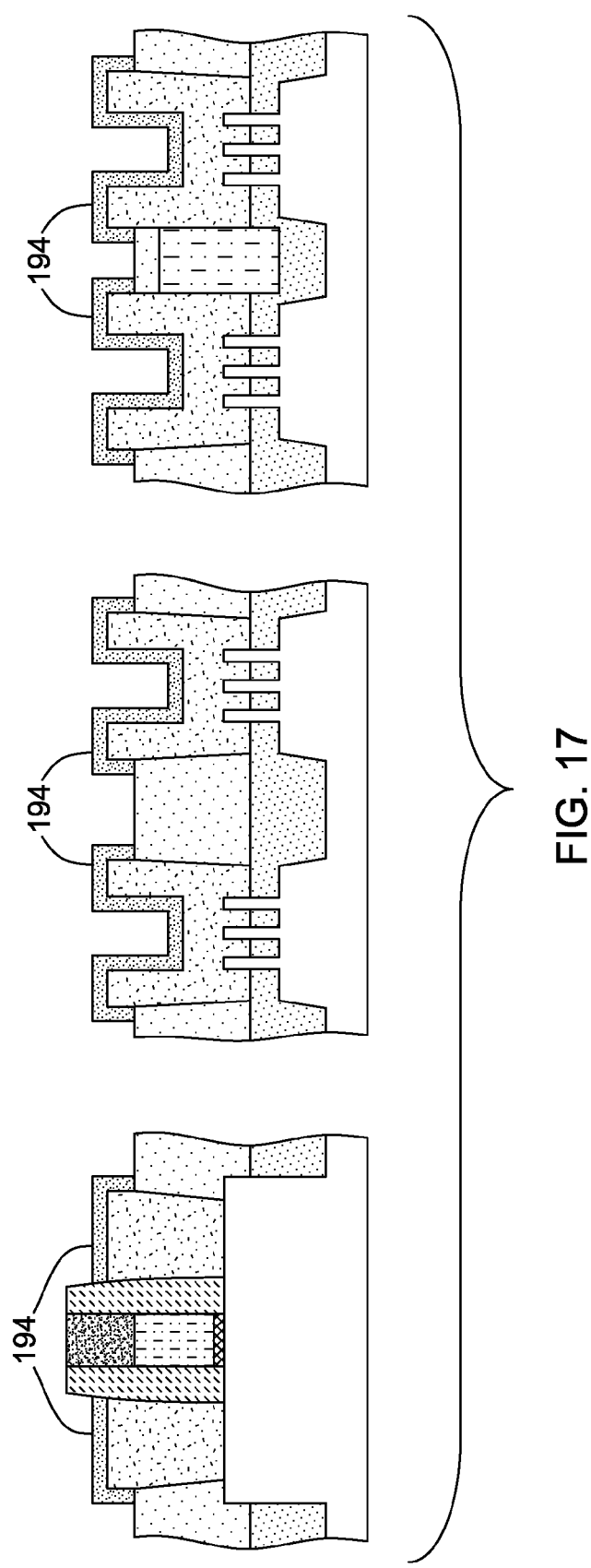
FIG. 17 depicts the structure of FIG. 16 after creating a layer of silicide on exposed surfaces of the epitaxial material, in accordance with one or more aspects of the present invention.

FIG. 17 depicts the structure of FIG. 16 after creating a layer 194 of silicide on exposed surfaces of epitaxial material 150, 152, 154, 156, 158 and 160, for example, using conventional processes and techniques, in accordance with one or more aspects of the present invention. Note that the effective silicide area is significantly greater than simply forming a layer of silicide on planar epitaxial material.

Figure 18:
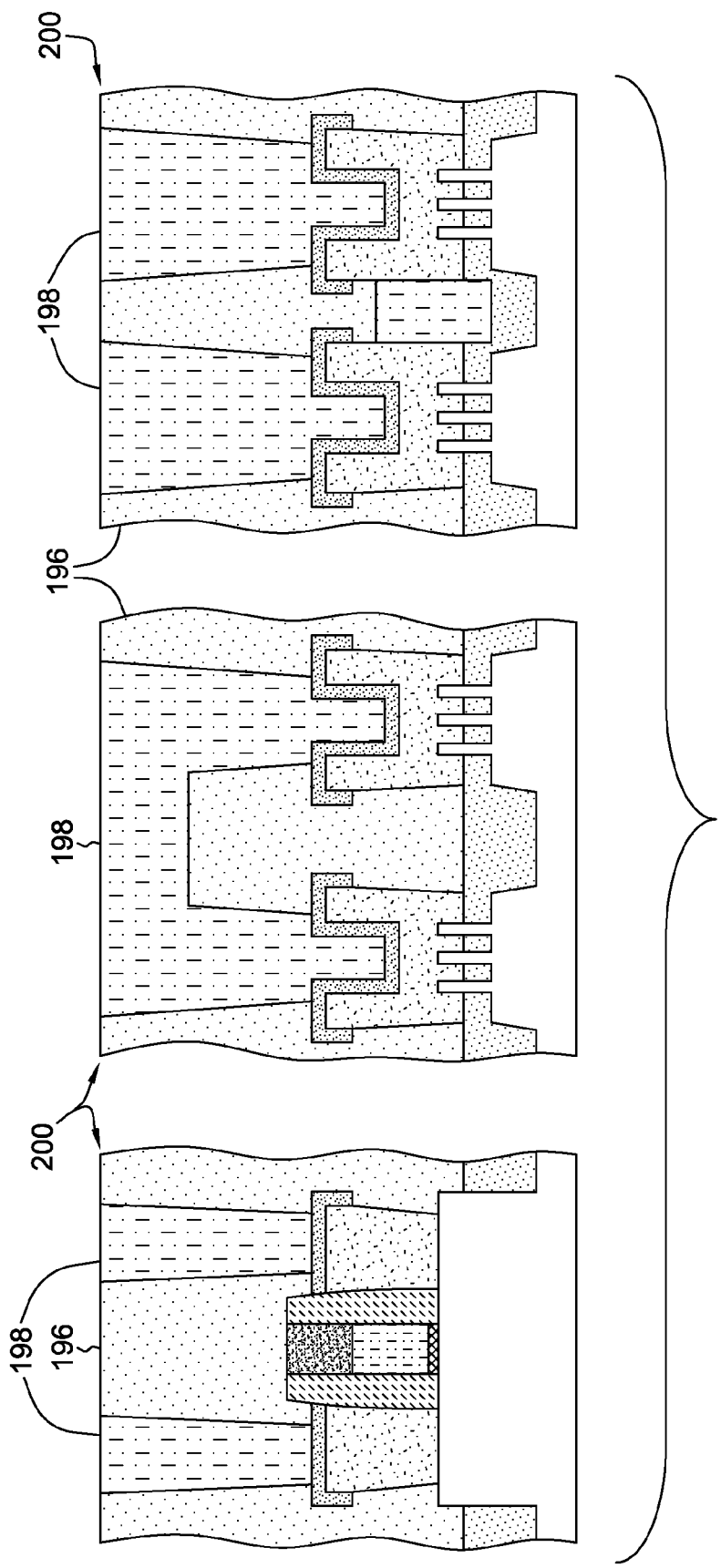
FIG. 18 depicts the structure of FIG. 17 after creating a conformal blanket layer of dielectric material (e.g., an interlayer dielectric material), creating contact openings therein to the silicide on the epitaxial material, filling the openings with conductive material and planarizing a top surface of the structure to remove excess conductive material, in accordance with one or more aspects of the present invention.

FIG. 18 depicts the structure of FIG. 17 after creating an additional layer 196 of dielectric material (e.g., an inter-layer dielectric material), creating contact openings therein to the silicide 194 on the epitaxial material, filling the openings with conductive material 198 and planarizing a top surface 200 of the structure to remove excess conductive material, in accordance with one or more aspects of the present invention. The dielectric layer, creation of contact openings, filling of the openings and planarizing may all be accomplished, for example, using conventional processes and techniques.

Figure 19:
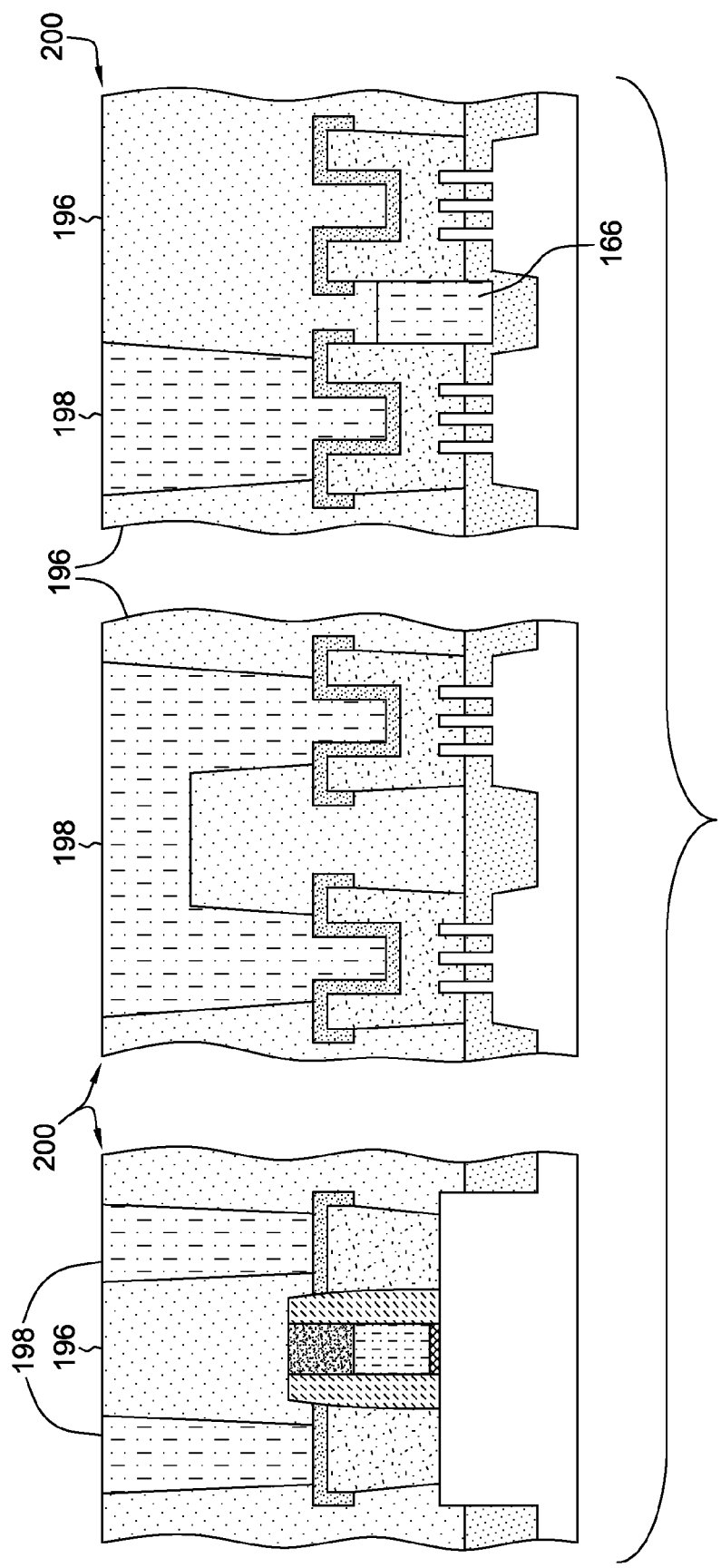
FIG. 19 depicts a structural alternative to that of FIG. 18.

FIG. 19 depicts an alternative to the non-planar structure of FIG. 18. Taking advantage of lower contact 166, it is possible to have one upper contact 198, rather than two as in FIG. 18.

In a first aspect, disclosed above is a method of improving contact resistivity in semiconductor devices. The method includes providing a starting semiconductor structure, the structure including a semiconductor substrate, raised structure(s) coupled to the substrate and surrounded at a lower portion thereof by a layer of isolation material, and dummy gate structure(s) encompassing a portion of the raised structure(s), each dummy gate structure being surrounded by a hard mask material, the hard mask material forming a cap and spacers for each dummy gate structure. The method further includes confinedly creating semiconductor epitaxial material above active region(s) of the raised structure(s) prior to replacing the dummy gate structure.

In one example, the method may further include, for example, filling with conductive material a portion of an open area between portions of epitaxial material and an opening therebelow in the isolation layer, replacing the dummy gate structure with a replacement gate structure, creating silicide on exposed surfaces of the epitaxial material, and creating one or more contacts to the epitaxial material.

In one example, the method may further include, for example, after replacing the dummy gate structure and before creating the silicide, recessing portions of the epitaxial material to create openings therein. Creating the silicide includes creating silicide on exposed recessed surfaces of the epitaxial material.

In one example, the method may include, for example, prior to filling with conductive material, opening a portion of the isolation layer below an open area between portions of epitaxial material. In one example, the method may further include, for example, after providing the starting semiconductor structure and prior to creating the epitaxial material, creating a layer of hard mask material over the starting semiconductor structure.

In one example, confinedly creating semiconductor epitaxial material in the method of the first aspect may include, for example, creating opening(s) to the active region(s). In one example, there may be multiple raised structures included, and creating the opening(s) may include, for example, creating a common opening to the multiple raised structures.

Where the common opening is present, the confinedly creating may include, for example, creating the epitaxial material in left and right lower portions of the common opening, the left and right lower portions being separated by a space. In one example, the method may further include, for example, partially filling the space with conductive material.

In one example, where the epitaxial material is created in left and right lower portions of the common opening, the method may further include, for example, removing a portion of the layer of isolation material, the removing creating an opening therein under the space separating the left and right lower portions of the epitaxial material. In one example, the method may further include, for example, filling with conductive material the opening in the layer of isolation material and partially filling the space above with the conductive material.

In one example, confinedly creating epitaxial material includes creating opening(s) to the active region(s), the method may further include, for example, creating the epitaxial material in a lower portion of the opening(s) to the active region(s). In one example, the method may further include, for example, creating a blanket conformal layer of dielectric material. In one example, where the blanket conformal layer of dielectric material is present, the method may further include, for example, replacing the dummy gate structure with a conductive gate structure and gate cap, and exposing a top portion of the epitaxial material. In one example, where the dummy gate structure is replaced, the method may further include, for example, recessing the epitaxial material, and creating silicide on exposed surfaces of the epitaxial material. In one example, the method may further include, for example, creating contact(s) over the silicide.

In a second aspect, disclosed above is a non-planar semiconductor structure. The structure includes a semiconductor substrate, multiple raised semiconductor structures coupled to the substrate and surrounded at a lower portion thereof by a layer of isolation material, and confined epitaxial material above active regions of multiple raised structures, the confined epitaxial material having recessed portion(s) therein. The structure further includes replacement gate structure(s) surrounding a portion of each raised structure, silicide on upper surfaces of a top portion of the confined epitaxial material, and multiple contacts to the silicide, the multiple contacts including separate contact(s) and common contact(s), each separate contact electrically coupled to only one of the confined epitaxial material areas and each common contact electrically coupling two adjacent areas of the confined epitaxial material.

In one example, the conductive material electrically coupling adjacent confined epitaxial material may be, for example, situated between lower portions of the adjacent confined epitaxial material. In one example, the conductive material electrically coupling the adjacent confined epitaxial material may extend, for example, into an opening in the layer of isolation material.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method, comprising:
   providing a starting semiconductor structure, the structure including a semiconductor substrate, at least one fin coupled to the substrate and surrounded at a lower portion thereof by a layer of isolation material, at least one dummy gate structure encompassing a portion of the at least one fin, each dummy gate structure being surrounded by a hard mask material, the hard mask material forming a cap and spacers for each dummy gate structure; and
   confinedly creating semiconductor epitaxial material above one or more active regions of the at least one fin prior to replacing the dummy gate structure, wherein the confinedly creating comprises:
      forming a blanket conformal dielectric layer above the structure;
      removing portions of the blanket conformal dielectric layer to expose the at least one fin; and
      growing the semiconductor epitaxial material using the exposed at least one fin as a seed, wherein walls of the dielectric material left by the removing serve to confine the growth of the semiconductor epitaxial material.

2. The method of claim 1, wherein the at least one fin comprises at least two fins, and wherein exposing the at least one fin comprises creating a common opening to the at least two fins.

3. The method of claim 2, wherein the at least two fins comprise at least two adjacent groups of at least two fins, the grown semiconductor epitaxial material for the at least two adjacent groups being separated by a space.

4. The method of claim 3, further comprising removing a portion of the layer of isolation material, the removing creating an opening therein under the space separating the grown semiconductor epitaxial material for the at least two adjacent groups.

5. The method of claim 3, further comprising partially filling the space with conductive material.

6. The method of claim 1, wherein the blanket conformal dielectric layer is initially higher than the hard mask material of the dummy gate structure, the method further comprising, prior to the removing portions:
   planarizing the blanket conformal dielectric layer down to the hard mask material of the dummy gate structure; and
   forming a hard mask layer above the planarized blanket conformal dielectric layer;
   wherein the removing portions further comprises also removing a corresponding portions of the hard mask layer.

7. A method, comprising:
   providing a starting semiconductor structure, the structure including a semiconductor substrate, at least one fin coupled to the substrate and surrounded at a lower portion thereof by a layer of isolation material, at least one dummy gate structure encompassing a portion of the at least one fin, each dummy gate structure being surrounded by a hard mask material, the hard mask material forming a cap and spacers for each dummy gate structure;
   confinedly creating semiconductor epitaxial material above one or more active regions of the at least one fin prior to replacing the dummy gate structure;
   filling with conductive material a portion of an open area between portions of epitaxial material and an opening therebelow in the isolation layer;
   replacing the dummy gate structure with a replacement gate structure;
   creating silicide on exposed surfaces of the epitaxial material; and
   creating one or more contacts to the epitaxial material.

8. The method of claim 7, further comprising, after the replacing and before creating the silicide, recessing portions of the epitaxial material, the recessing creating openings therein, and wherein creating the silicide comprises creating silicide on exposed recessed surfaces of the epitaxial material.

9. The method of claim 7, further comprising, prior to the filling, opening a portion of the isolation layer below an open area between portions of epitaxial material.

10. The method of claim 9, further comprising, after the providing and prior to creating the epitaxial material, creating a layer of hard mask material over the starting semiconductor structure.

11. The method of claim 7, further comprising:
    filling with conductive material the opening in the layer of isolation material and partially filling the space above with the conductive material;
    wherein the confinedly creating comprises creating at least one opening to the one or more active regions;
    wherein the at least one fin comprises at least two fins, and wherein creating the at least one opening comprises creating a common opening to the at least two fins;
    wherein the confinedly creating comprises creating the epitaxial material in left and right lower portions of the common opening, the left and right lower portions being separated by a space; and
    the method further comprises removing a portion of the layer of isolation material, the removing creating an opening therein under the space separating the left and right lower portions of the epitaxial material.

12. The method of claim 7, wherein the confinedly creating comprises creating the epitaxial material in a lower portion of the at least one opening to the one or more active regions.

13. The method of claim 12, further comprising creating a blanket conformal layer of dielectric material.

14. The method of claim 13, further comprising:
    replacing the dummy gate structure with a conductive gate structure and gate cap; and
    exposing a top portion of the epitaxial material.

15. The method of claim 14, further comprising:
    recessing the epitaxial material; and
    creating silicide on exposed surfaces of the epitaxial material.

16. The method of claim 15, further comprising creating one or more contacts over the silicide.

17. A non-planar semiconductor structure, comprising:
a semiconductor substrate;
a plurality of fins coupled to the substrate and surrounded at a lower portion thereof by a layer of isolation material;
confined epitaxial material above active regions of the plurality of fins, the confined epitaxial material having at least one recessed portion therein;
at least one replacement gate structure surrounding a portion of each fin, the at least one replacement gate structure comprising a cap and spacers, wherein the confined epitaxial material, in a cross-section taken through a fin, is confined horizontally along an entire height thereof by each spacer and a corresponding wall of dielectric material;
silicide on upper surfaces of a top portion of the confined epitaxial material; and
a plurality of contacts to the silicide, the plurality of contacts comprising at least one separate contact and at least one common contact, each separate contact electrically coupled to only one of the confined epitaxial material areas and each common contact electrically coupling two adjacent areas of the confined epitaxial material.

18. The non-planar semiconductor structure of claim 17, wherein the conductive material electrically coupling adjacent confined epitaxial material is situated between lower portions of the adjacent confined epitaxial material.

19. The non-planar semiconductor structure of claim 18, wherein the conductive material electrically coupling the adjacent confined epitaxial material extends into an opening in the layer of isolation material.

* * * * *